United States Patent
Okuda et al.

(10) Patent No.: US 11,742,313 B2
(45) Date of Patent: Aug. 29, 2023

(54) PRESSURE-CONTACT SEMICONDUCTOR DEVICE

(71) Applicant: Mitsubishi Electric Corporation, Tokyo (JP)

(72) Inventors: Satoshi Okuda, Tokyo (JP); Tatsuro Watahiki, Tokyo (JP); Tomohiro Tamaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 252 days.

(21) Appl. No.: 17/424,912

(22) PCT Filed: Mar. 12, 2019

(86) PCT No.: PCT/JP2019/009939
§ 371 (c)(1),
(2) Date: Jul. 22, 2021

(87) PCT Pub. No.: WO2020/183603
PCT Pub. Date: Sep. 17, 2020

(65) Prior Publication Data
US 2022/0108972 A1      Apr. 7, 2022

(51) Int. Cl.
*H01L 25/07*    (2006.01)
*H01L 23/00*    (2006.01)
*H01L 25/18*    (2023.01)

(52) U.S. Cl.
CPC ............ *H01L 24/72* (2013.01); *H01L 25/072* (2013.01); *H01L 25/18* (2013.01)

(58) Field of Classification Search
CPC ....... H01L 24/72; H01L 25/072; H01L 25/18; H01L 24/06; H01L 24/29; H01L 24/32; H01L 24/83; H01L 29/7397; H01L 2224/06181; H01L 2224/29101; H01L 2224/32245; H01L 2224/83455; H01L 2224/83801; H01L 2924/1203; H01L 2924/13055; H01L 23/051; H01L 2224/0603

See application file for complete search history.

(56) References Cited

FOREIGN PATENT DOCUMENTS

JP    2003-264266 A    9/2003
JP    2005-72351 A     3/2005

OTHER PUBLICATIONS

International Search Report and Written Opinion dated Apr. 16, 2019, received for PCT Application PCT/JP2019/009939, Filed on Mar. 12, 2019, 6 pages including English Translation.

*Primary Examiner* — Elias Ullah
(74) *Attorney, Agent, or Firm* — XSENSUS LLP

(57) ABSTRACT

An object of the present invention is to suppress electrical contact between an outer peripheral portion of an intermediate electrode and a front surface electrode of a semiconductor chip without increasing the area of the semiconductor chip. A facing surface of the first intermediate electrode facing a first main electrode is smaller than a facing surface of the first main electrode facing the first intermediate electrode, and has an outer peripheral protective region and a connection region surrounded by the protective region. A pressure-contact semiconductor device includes a plurality of first conductor films partially formed in the connection region, and a first insulating film formed in regions in the connection region where no first conductor films are formed and in the protective region.

6 Claims, 14 Drawing Sheets

F I G. 1 3
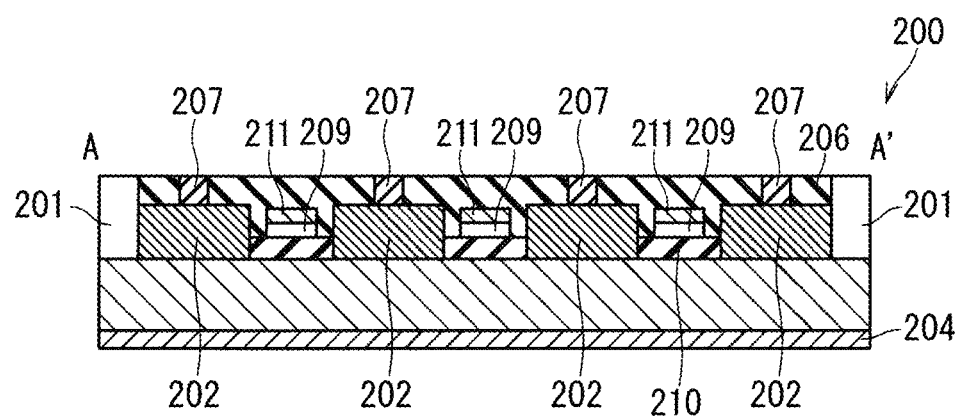

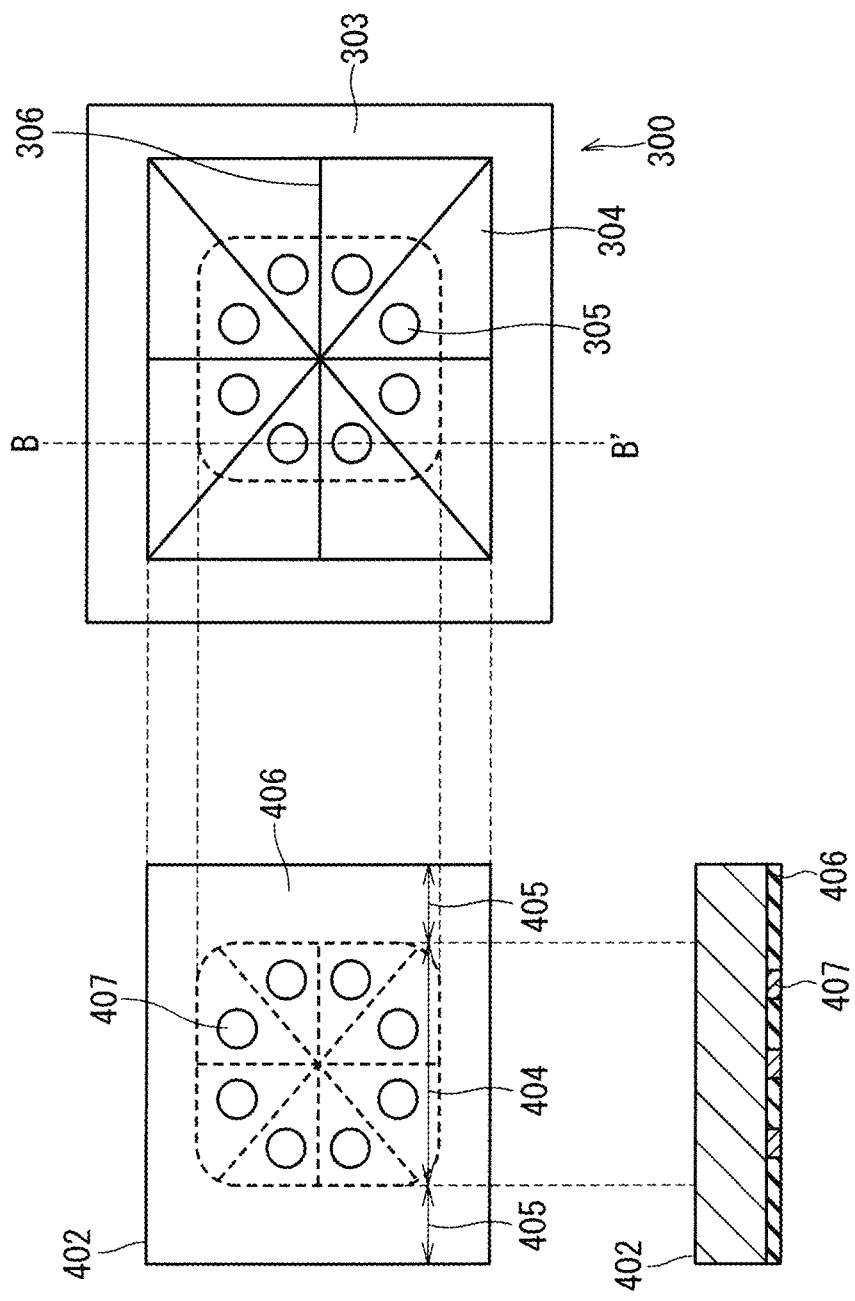

PRESSURE-CONTACT SEMICONDUCTOR DEVICE

CROSS-REFERENCE TO RELATED APPLICATIONS

The present application is based on PCT filing PCT/JP2019/009939, filed Mar. 12, 2019, the entire contents of which are incorporated herein by reference.

TECHNICAL FIELD

The present invention relates to a pressure-contact semiconductor device.

BACKGROUND ART

Power modules for electric power convert or control a high voltage of several kilovolts and a large current of several kiloamperes, and further increase in capacity is required. A plurality of semiconductor elements are mounted in parallel in a large-capacity power module. In recent years, the demand for power modules has been increasing under harsh environments such as offshore wind power generation, and power modules with high reliability and redundancy are demanded. In such a situation, a pressure-contact semiconductor device is attracting attention instead of the conventional bonding type. A plurality of semiconductor chips are mounted on the pressure-contact semiconductor device, and metal blocks are provided above and below the semiconductor chips as intermediate electrodes. Further, the electrical contact inside the device is maintained by being pressed from above and below the intermediate electrode via common electrode plates.

PRIOR ART DOCUMENTS

Patent Documents

[Patent Document 1] Japanese Patent Application Laid-Open No. 2003-264266
[Patent Document 2] Japanese Patent Application Laid-Open No. 2005-72351

SUMMARY

Problem to be Solved by the Invention

In the pressure-contact semiconductor device, an intensive pressure is applied to the outer periphery of the intermediate electrode when the intermediate electrode pressurizes the front surface electrode of the semiconductor chip. This local application of pressure cracks and breaks the semiconductor chip in many cases. Further, there has been a problem that the contact resistance between the intermediate electrode and the semiconductor chip changes due to the variance of pressure applied in the modular surface.

As a method for solving the problem, Patent Document 1 discloses a method in which a buffer region is provided between the active region and the terminal region of the IGBT chip, and a pedestal portion higher than the active region is provided in the buffer region so that the outer peripheral portion of the front surface intermediate electrode is pressurized with the pedestal portion being pressed to make a contact between the central portion of the block and the active region. The method ensures to suppress the outer peripheral portion of the front surface intermediate electrode and the front surface electrode of the semiconductor chip from coming into contact with each other. However, the method requires to increase the chip size in order to newly provide the buffer area, leading to an increase in size of the module which lowers the productivity. In addition, a step of forming a pedestal on the buffer region is required, which makes the manufacturing process intricate.

The present invention has been made to solve the above-mentioned problems, and an object of the present invention is to suppress electrical contact between an outer peripheral portion of an intermediate electrode and a front surface electrode of a semiconductor chip without increasing the area of the semiconductor chip.

Means to Solve the Problem

According to the present invention a pressure-contact semiconductor device includes a plurality of semiconductor chips each having a first main electrode and a second main electrode on a front surface and a rear surface thereof, a first intermediate electrode facing the first main electrode of the semiconductor chip, a first common electrode plate provided on a side opposite to a facing surface of the front surface intermediate electrode facing the first main electrode, and a second common electrode plate provided facing the second main electrode, in which the facing surface of the first intermediate electrode facing the first main electrode is smaller than a facing surface of the first main electrode facing the first intermediate electrode, has an outer peripheral protective region and a connection region surrounded by the protective region. According to the present invention, the pressure-contact semiconductor device includes a plurality of first conductor films partially formed in the connection region, and a first insulating film formed in regions in the connection region where no first conductor films are formed and in the protective region.

Effects of the Invention

According to the pressure-contact semiconductor device of the present invention, the first intermediate electrode conducts with the first main electrode in the connection region by the first conductor film; therefore, this ensures to suppress the outer peripheral portion of the first intermediate electrode from electrically contacting the outer peripheral portion of the semiconductor chip without an increase in the area of the semiconductor chip. The objects, features, aspects, and advantages of the present invention will become more apparent from the following detailed description and the accompanying drawings.

BRIEF DESCRIPTION OF DRAWINGS

FIG. 13 A cross-sectional view of the IGBT chip along the line A-A' of FIG. 12.

FIG. 14 A diagram illustrating a structure of a contact portion between an anode intermediate electrode and a diode chip in Embodiment 3.

DESCRIPTION OF EMBODIMENTS

A. Underlying Technique

Figure 1:
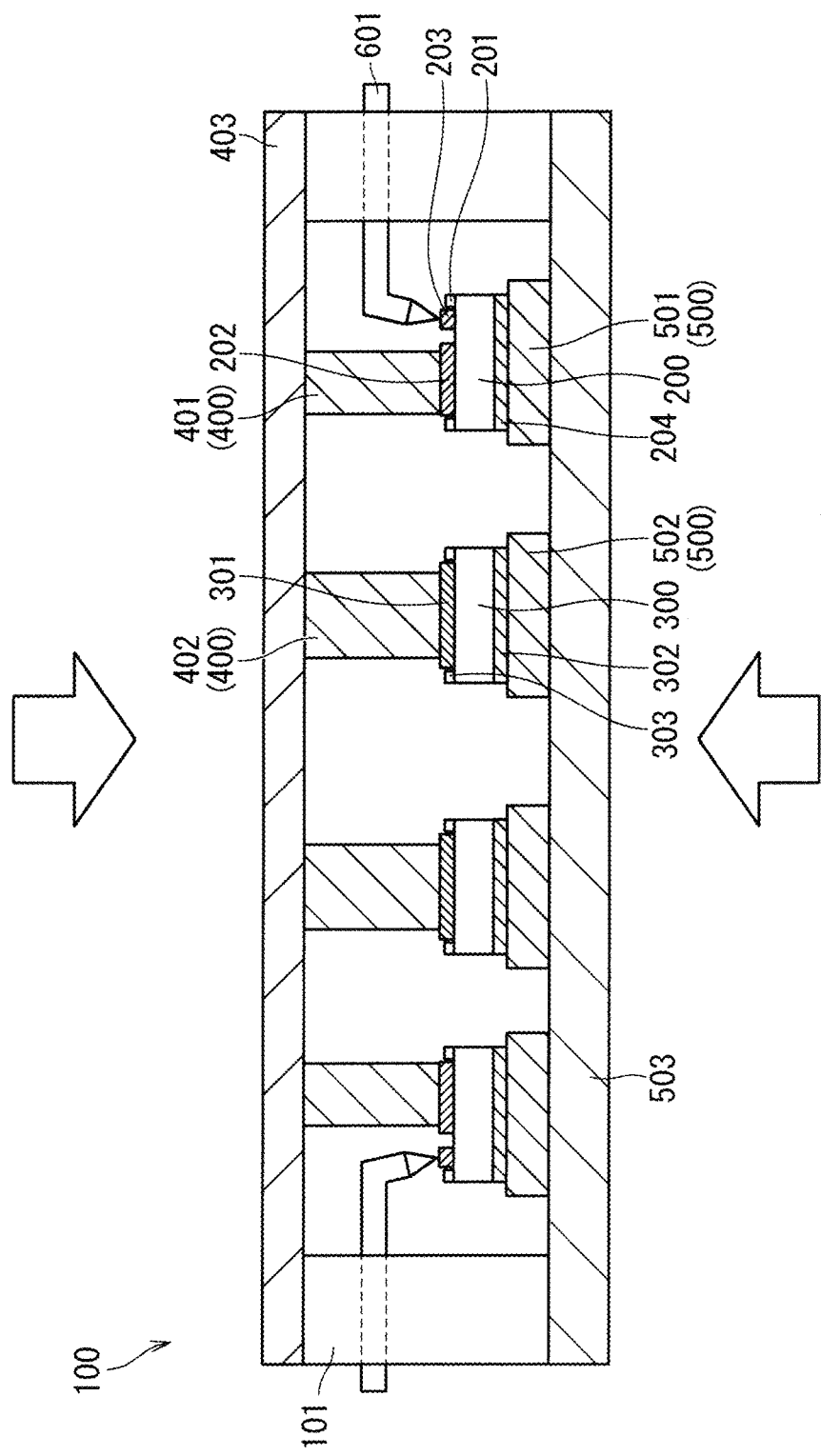
FIG. 1 A cross-sectional view of a pressure-contact semiconductor device of an underlying technique.

FIG. 1 is a cross-sectional view of a pressure-contact semiconductor device 100 of an underlying technique. The pressure-contact semiconductor device 100 includes a plurality of Insulated Gate Bipolar Transistor (IGBT) chips 200 and a plurality of diode chips 300. Here, IGBT chips and diode chips are given as examples of semiconductor chips.

A terminal region 201, an emitter electrode 202 being a surface electrode, and a gate pad 203 are provided on the front surface of the IGBT chip 200, and a collector electrode 204 is provided on the rear surface. The emitter electrode 202 is also referred to as a first main electrode, and the collector electrode 204 is also referred to as a second main electrode. An emitter intermediate electrode 401 is provided directly above the emitter electrode 202. In other words, the emitter intermediate electrode 401 faces the emitter electrode 202 of the IGBT chip 200. A collector intermediate electrode 501 is provided directly below the collector electrode 204.

An anode electrode 301 being surface electrodes and a terminal region 303, are provided on the front surface of the diode chip 300, and a cathode electrode 302 is provided on the rear surface thereof. An anode intermediate electrode 402 is provided directly above the anode electrode 301. A cathode intermediate electrode 502 is provided directly below the cathode electrode 302. In the present specification, the emitter intermediate electrode 401 and the anode intermediate electrode 402 are collectively referred to as a front surface intermediate electrode 400, and the collector intermediate electrode 501 and the cathode intermediate electrode 502 are collectively referred to as a rear surface intermediate electrode 500. The front surface intermediate electrode 400 is also referred to as a first intermediate electrode. The front surface intermediate electrode 400 and the rear surface intermediate electrode 500 are also referred to simply as an intermediate electrode.

An emitter common electrode plate 403 being a first common electrode plate, is provided above the front surface intermediate electrode 400, and a collector common electrode plate 503 being a second common electrode plate, is provided below the rear surface intermediate electrode 500. In the present specification, the emitter common electrode plate 403 and the collector common electrode plate 503 are collectively referred to simply as a common electrode plate. By pressurizing the common electrode plates from above and below, the IGBT chips 200 are connected in parallel and the diode chips 300 are connected in parallel via the intermediate electrodes, and the IGBT chip 200 and the diode chip 300 are connected in antiparallel to each other. That is, the diode chip 300 functions as a free wheeling diode (FWD). The semiconductor chip may come into direct contact with the collector common electrode plate 503, and in this case, the rear surface intermediate electrode 500 is unrequired.

A control terminal 601 provided with a spring pin or the like is connected to the gate pad 203 of the IGBT chip 200. The control terminal 601 is led out to the outside of a housing and is connected to a gate drive circuit (not illustrated). The common electrode plate is made of a metal plate such as copper. The intermediate electrode is made of a metal such as copper, tungsten or molybdenum. The rear surface intermediate electrode 500 is fixed to the collector electrode 204 and the cathode electrode 302 with, for example, solder. A plating film such as nickel may be formed on the contact surface between the intermediate electrode and the semiconductor chip in order to reduce the contact resistance.

Although the front surface intermediate electrode 400 is illustrated as a mere metal block in FIG. 1, a structure may be adoptable in which the metal block and the spring thereabove are integrated. With such a structure, the variation in pressure applied between the semiconductor chips is absorbed by the spring.

When the pressure-contact semiconductor device 100 is pressurized from above and below, the pressure applied to the front surface intermediate electrode 400 is intense on the outermost periphery of the metal block. In order to reduce the resistance between the semiconductor chip and the front surface intermediate electrode 400 or suppress the occurrence of arc discharge at the time of short-circuit fracture, application of a sufficiently high pressure to the common electrode plates is required. Accordingly, application of a high pressure locally to the outer peripheral portion of the semiconductor chip via the front surface intermediate electrode 400 is a cause of cracks in the semiconductor chip.

The contact area between the front surface electrode of the semiconductor chip and the front surface intermediate electrode 400 gradually increases from the outer circumference toward the inside as the pressure increases. If the pressure applied to each semiconductor chip varies, the contact resistance between the front surface electrode of each semiconductor chip and the front surface intermediate electrode 400 varies, causing non-uniform current, which reduces the reliability of the pressure-contact semiconductor device 100.

Therefore, in following Embodiments, a pressure-contact semiconductor device will be described which suppresses a change in contact resistance between the outer peripheral portion of the front surface intermediate electrode 400 and the front surface electrode of the semiconductor chip without increasing the area of the semiconductor chip.

B. Embodiment 1

The pressure-contact semiconductor device of Embodiment 1 is a pressure-contact semiconductor device in which a device for the contact portion between the front surface intermediate electrode 400 and the semiconductor chip is applied to the pressure-contact semiconductor device 100 of the underlying technology illustrated in FIG. 1, and other than that, the configuration thereof is the same as that of the pressure-contact semiconductor device 100. Hereinafter, the configuration of the contact portion between the front surface intermediate electrode 400 and the semiconductor chip in the pressure-contact semiconductor device of Embodiment 1 will be described with reference to FIGS. 2 and 3.

Figure 2:
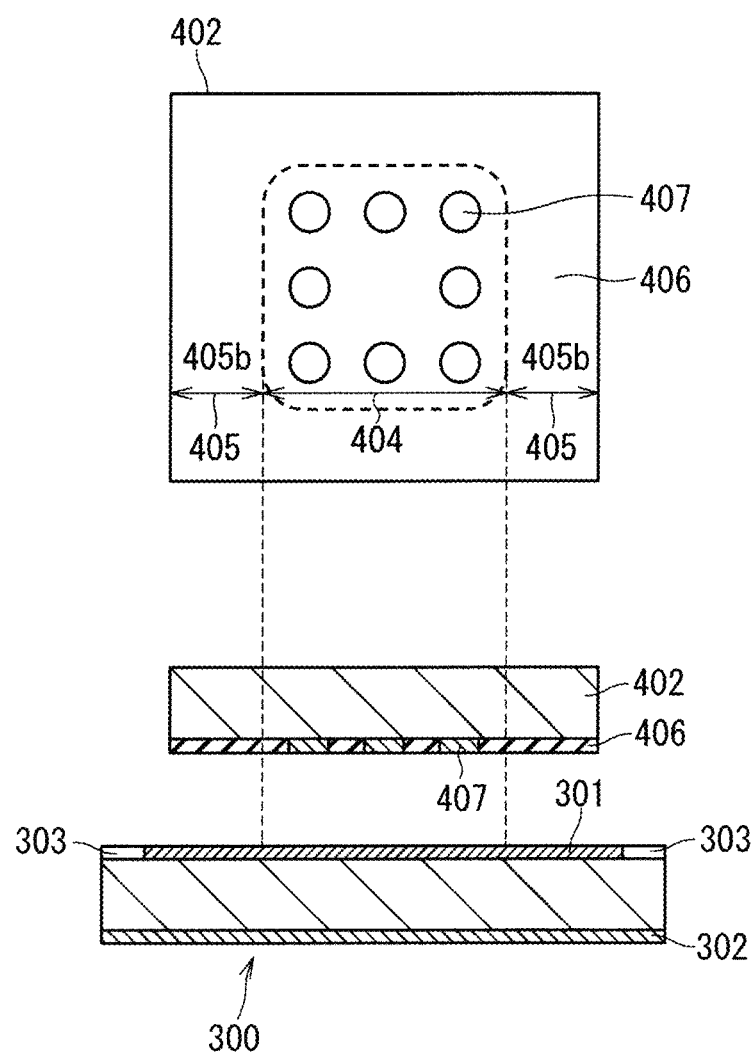
FIG. 2 A diagram illustrating a structure of a contact portion between an anode intermediate electrode and a diode chip in Embodiment 1.

FIG. 2 illustrates the configuration on the diode chip 300 side. In FIG. 2, the contact surface of the anode intermediate electrode 402 with the diode chip 300 is illustrated in the upper part, a cross-sectional view of the anode intermediate electrode 402 is illustrated in the middle part, and a cross-sectional view of the diode chip 300 is illustrated in the lower part.

The dotted lines in FIG. 2 indicate the positional relationship between the anode intermediate electrode 402 and the diode chip 300. As illustrated by the dotted lines, the contact surface of the anode intermediate electrode 402 with respect to the diode chip 300 is smaller than that of the anode electrode 301 of the diode chip 300. In other words, the anode intermediate electrode 402 is arranged inside the anode electrode 301. As long as this condition is satisfied, an arbitrary size and shape can be adopted for the contact surface of the anode intermediate electrode 402 with respect to the diode chip 300.

The contact surface of the front surface intermediate electrode 400 with respect to the semiconductor chip is divided into a protective region 405 on the outer peripheral portion and a connection region 404 inside the protective region 405. A plurality of conductor films 407 are formed in the connection region 404, and the connection region 404 establishes electrical contact between the front surface intermediate electrode 400 and the semiconductor chip. The width 405b of the protective region 405 is preferably about 5 to 15% of the length of a side of the metal block constituting the anode intermediate electrode 402. The protective region 405 and the region of the connection region 404 where the conductor films 407 are not formed are covered with the insulating film 406. The conductor films 407 are preferably arranged point-symmetrically with respect to the center of gravity of the contact surface of the anode intermediate electrode 402 with respect to the diode chip 300.

Figure 3:
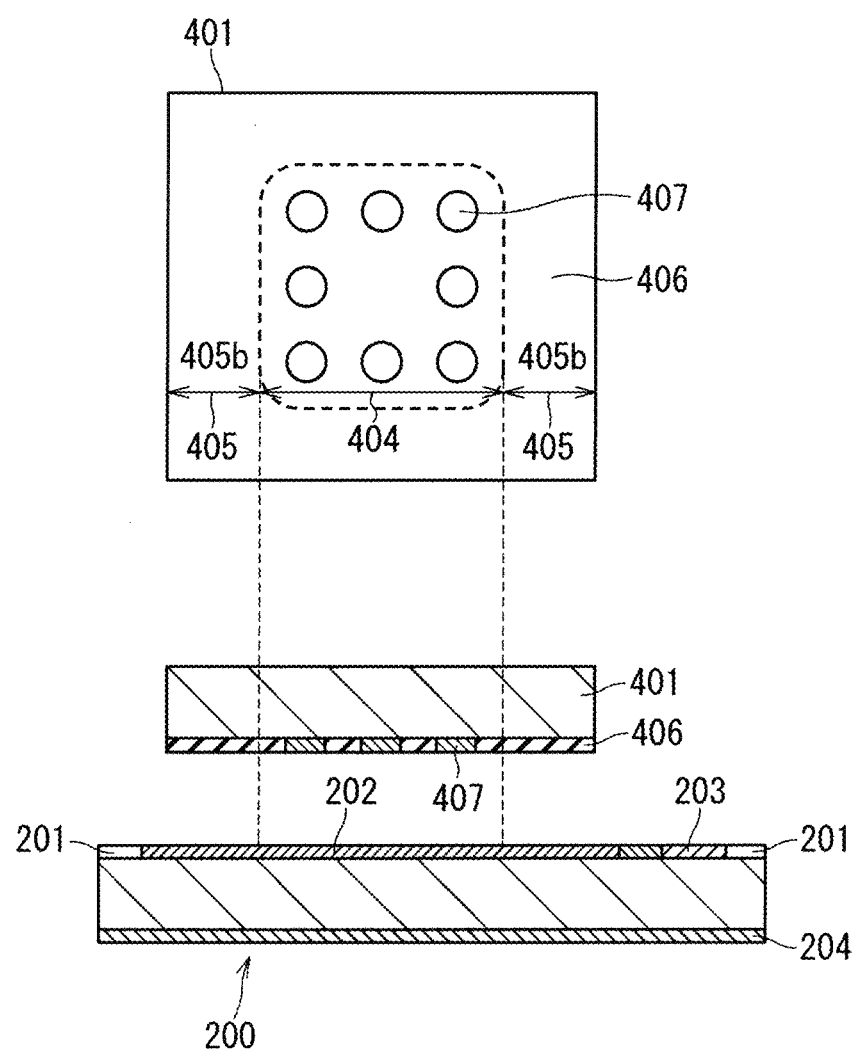
FIG. 3 A diagram illustrating a structure of a contact portion between an emitter intermediate electrode and an IGBT chip in Embodiment 1.

FIG. 3 illustrates the configuration on the IGBT chip 200 side. In FIG. 3, the contact surface of the emitter intermediate electrode 401 with the IGBT chip 200 is illustrated in the upper part, a cross-sectional view of the emitter intermediate electrode 401 is illustrated in the middle part, and a cross-sectional view of the IGBT chip 200 is illustrated in the lower part.

The dotted lines in FIG. 3 indicate the positional relationship between the emitter intermediate electrode 401 and the IGBT chip 200. As illustrated by the dotted lines, the contact surface of the emitter intermediate electrode 401 with respect to the IGBT chip 200 is smaller than that of the emitter electrode 202 of the IGBT chip 200. In other words, the emitter intermediate electrode 401 is arranged inside the emitter electrode 202. As long as this condition is satisfied, an arbitrary size and shape can be adopted for the contact surface of the emitter intermediate electrode 401 with respect to the IGBT chip 200.

As is the same with the anode intermediate electrode 402, the contact surface of the emitter intermediate electrode 401 with respect to the IGBT chip 200 is divided into a protective region 405 and a connection region 404. The arrangement of the conductor films 407 in the protective region 405 is the same for the anode intermediate electrode 402 and the emitter intermediate electrode 401.

During the time where the pressure applied to the front surface intermediate electrode 400 is small, the pressure is applied only to the outer peripheral portion of the front surface intermediate electrode 400. However, as the pressure increases, pressure is gradually applied to the inside of the front surface intermediate electrode 400. According to the pressure-contact semiconductor device of Embodiment 1, the contact surface of the front surface intermediate electrode 400 with respect to the semiconductor chip is configured as illustrated in FIGS. 2 and 3; therefore, each conductor film 407 and the semiconductor chip are pressurized in a well-balanced manner, variations in contact resistance are suppressed.

The insulating film 406 is formed by depositing an oxide or a nitride by, for example, sputtering or vapor deposition. Alternatively, the insulating film 406 is formed by a method such as spraying an insulating paint or resin with a spray or spin coating with a spin coater. At this point, the regions where the conductor films 407 are formed are protected by a metal mask, tape, or the like so that the insulating film is not formed in the regions. Alternatively, after forming the insulating film overall, the insulating film in the regions where the conductor films 407 are formed is removed.

As in the same with the insulating film 406, the conductor films 407 are formed by forming a metal film by sputtering, vapor deposition, or the like. Alternatively, a thick film metal may be formed by electrolytic plating to adopt as the conductor films 407.

The pressure-contact power semiconductor device according to Embodiment 1 includes a plurality of semiconductor chips each having a first main electrode and a second main electrode on a front surface and a rear surface thereof, respectively, the front surface intermediate electrode 400 being a first intermediate electrode facing the first main electrode of the semiconductor chip, an emitter common electrode plate 403 being a first common electrode plate provided on the side opposite to the facing surface of the front surface intermediate electrode 400 facing the first main electrode, and a collector common electrode plate 503 being a second common electrode plate provided facing the second main electrode. The facing surface of the front surface intermediate electrode 400 facing the first main electrode is smaller than the facing surface of the first main electrode facing the front surface intermediate electrode 400 and has the outer peripheral protective region 405 and the connection region 404 surrounded by the protective region 405. The pressure-contact semiconductor device of Embodiment 1 includes the conductor films 407 being a plurality of first conductor films partially formed in the connection region 404, and the insulating film 406 being a first insulating film formed in the regions in the connection region 404 where no conductor films 407 are formed and in the protective region 405.

With such a configuration above, the pressure-contact power semiconductor device according to Embodiment 1, the front surface intermediate electrode 400 conducts with the first main electrode of the semiconductor chip in the connection region 404 not with the protective region 405 of the outer peripheral portion; therefore, this ensures to suppress the outer peripheral portion of the front surface intermediate electrode 400 from electrically contacting the outer peripheral portion of the semiconductor chip without an increase in the area of the semiconductor chip.

Further, when the conductor films 407 are arranged point-symmetrically with respect to the center of gravity of the contact surface in the contact surface of the front surface intermediate electrode 400 with respect to the semiconductor chip, that is, in the facing surface therebetween, the contact resistance between each of the front surface intermediate electrode 400 and the semiconductor chip is uniformed. Accordingly, the variation in current applied between the semiconductor chips in the pressure-contact semiconductor device is suppressed, and the reliability of the pressure-contact semiconductor device is improved.

Further, by using a soft resin such as polyimide as the material of the insulating film 406, the insulating film 406 can also function as a buffer member on the outer peripheral portion of the front surface intermediate electrode 400 to which a high pressure is applied. Accordingly, cracks are suppressed from happening in the semiconductor chip even when a high pressure is applied thereto, and the productivity and reliability of the pressure-contact semiconductor device are improved.

Further, by covering the outer peripheral portion of the front surface intermediate electrode 400 with the insulating film 406, even if a positional displacement occurs between the semiconductor chip and the front surface intermediate electrode 400 and the front surface intermediate electrode 400 presses the gate pad 203 or the terminal regions 201 and 303, an electrical short circuit does not occur; therefore, defects during assembly are reduced.

In one of the working examples of Patent Document 2, a buffer plate is provided so as to face the emitter electrode of the IGBT chip. The buffer plate of Patent Document 2 includes a plurality of electrode members and an insulating member that separates the electrode members. This buffer plate is considered to correspond to the front surface intermediate electrode in Embodiment 1. The pressure-contact semiconductor devices of Embodiment 1 and Patent Document 2 have a common feature in that the energizable region of the front surface intermediate electrode is limited. However, no description is made in Patent Document 2 on the arrangement and area of the conductor region in the front surface intermediate electrode.

For example, when a plurality of conductor regions are designed to be in contact with each other at the outer peripheral portion and the central portion of the IGBT chip, the outer peripheral portion of the IGBT chip and the conductor portions of the front surface intermediate electrode are preferentially in contact, because the pressure to the front surface intermediate electrode is generally applied intensively to the outer peripheral portion. In this case, the energization region is limited to the outer peripheral portion; therefore, the electric resistance between the collector electrode and the emitter electrode increases and increasing the loss of the power module. Or, the energization area is excessively limited and the current is concentrated to generate the heat, which may possibly damage the IGBT chip. Further, when the pressure is increased, the central part of the IGBT chip also comes into contact with the emitter electrode of the front surface intermediate electrode; therefore, as the pressure increases, the contact area between the IGBT chip and the front surface intermediate electrode increases, decreasing the resistance between the collector electrode and emitter electrode. The resistance of the IGBT chip changes depending on the pressure, the amount of current applied between the IGBT chips in the pressure-contact semiconductor device becomes non-uniform, and the reliability of the device deteriorates.

Meanwhile, according to Embodiment 1, the conduction region is limited to the region where a uniform pressure is applied; therefore, a stable collector-emitter electrode resistance can be obtained regardless of the pressure variation. Accordingly, a highly reliable pressure-contact semiconductor device can be obtained with no increase in loss.

In addition, according to the manufacturing method of the prior art document, the conductor member and the insulating member are made of different materials, and one front surface intermediate electrode is formed by combining the two. Meanwhile, in the manufacturing method of Embodiment 1, the insulating region and the conductor region are formed by patterning the surface of the front surface intermediate electrode 400. Therefore, there is no increase in the number of parts, and this provides an advantage in a high degree of freedom in designing in the conductor region along with manufacturing being facilitated.

Figure 4:
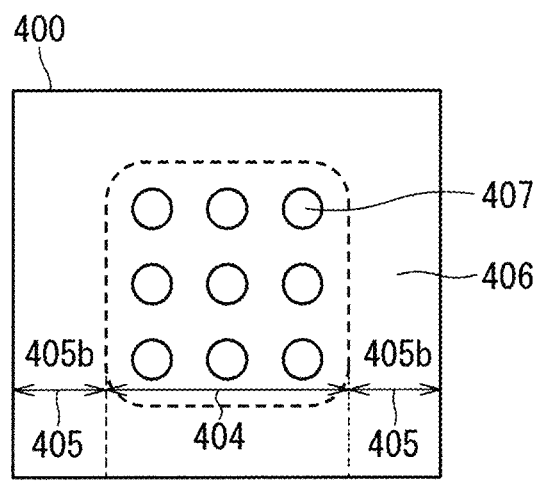
FIG. 4 A top view of a contact surface of a front surface intermediate electrode with respect to a semiconductor chip in Modification of Embodiment 1.
Figure 5:
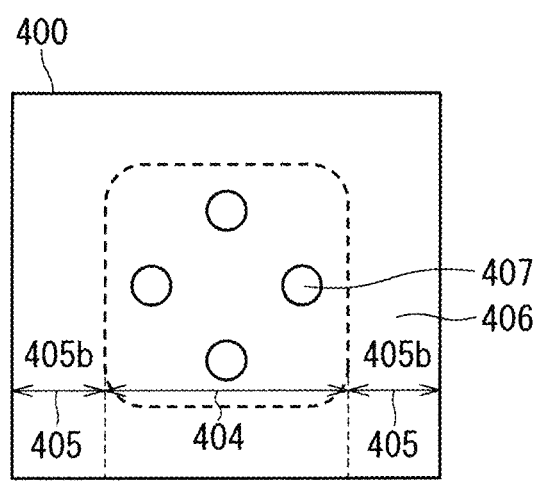
FIG. 5 A top view of a contact surface of a front surface intermediate electrode with respect to a semiconductor chip in Modification of Embodiment 1.
Figure 6:
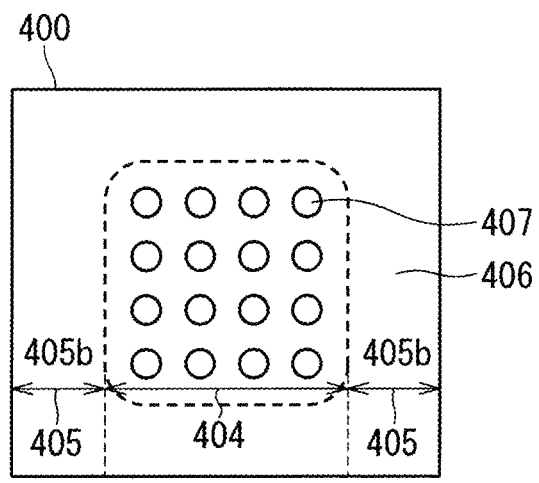
FIG. 6 A top view of a contact surface of a front surface intermediate electrode with respect to a semiconductor chip in Modification of Embodiment 1.
Figure 7:
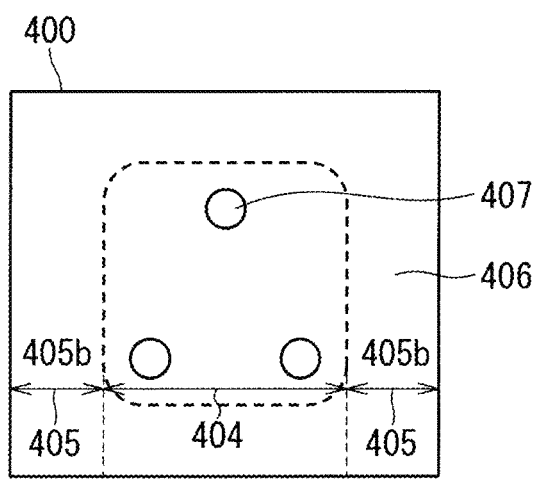
FIG. 7 A top view of a contact surface of a front surface intermediate electrode with respect to a semiconductor chip in Modification of Embodiment 1.
Figure 8:
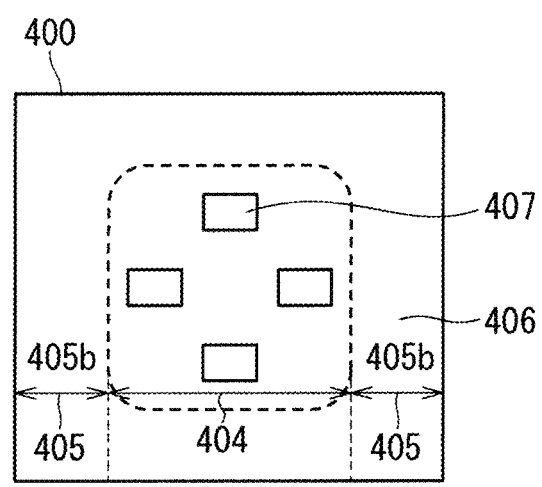
FIG. 8 A top view of a contact surface of a front surface intermediate electrode with respect to a semiconductor chip in Modification of Embodiment 1.

Modification of the contact surface of the front surface intermediate electrode 400 with respect to the semiconductor chip is illustrated in FIGS. 4 to 8. In FIGS. 2 and 3, the conductor films 407 are not formed on the center of gravity of the front surface intermediate electrode 400. However, as illustrated in FIG. 4, a conductor film 407 may be formed on the center of gravity of the front surface intermediate electrode 400. The number of divisions of the conductor film 407 is arbitrary, and may be, for example, 4 as illustrated in FIG. 5, 16 as illustrated in FIGS. 6, and 3 as illustrated in FIG. 7. Although it is preferable that the conductor films 407 have the same size, the above-mentioned effects can be obtained even if they do not necessarily have the same size. Also, the shape of the conductor films 407 does not have to be circular, and may be rectangular as illustrated in FIG. 8, for example. Further, the conductor films 407 having a plurality of shapes may be used in combination.

Although in FIG. 1, IGBTs and free wheeling diodes are employed for the semiconductor chips mounted on the pressure-contact semiconductor device 100, the types of semiconductor chips are not limited thereto. For example, a Metal-Oxide-Semiconductor Field-Effect Transistor (MOSFET) may be employed instead of an IGBT. The number of IGBT chips 200 and diode chips 300 can be arbitrarily changed in accordance with the rated current of the module. The number of IGBT chips 200 and the number of diode chips 300 do not have to be the same. For example, the number of IGBT chips 200 may be twice the number of diode chips 300. Any material such as silicon, gallium nitride, silicon carbide, aluminum nitride, gallium oxide or diamond is used for the substrate of the semiconductor chip depending on the application.

Also, instead of the IGBT chip 200 and the diode chip 300, a reverse-conducting IGBT (RC-IGBT) may be employed. In this case, the structure illustrated in FIG. 3 is applicable to the structure of the contact surface of the front surface intermediate electrode 400 with respect to the reverse-conducting IGBT chip.

C. Embodiment 2

This is a pressure-contact semiconductor device obtained by changing the configuration of the contact portion between the emitter intermediate electrode 401 and the IGBT chip 200 in the pressure-contact semiconductor device of Embodiment 1. Hereinafter, the configuration of the contact portion between the emitter intermediate electrode 401 and the IGBT chip 200 in the pressure-contact semiconductor device of Embodiment 2 will be described with reference to FIGS. 9 to 11.

Figure 9:
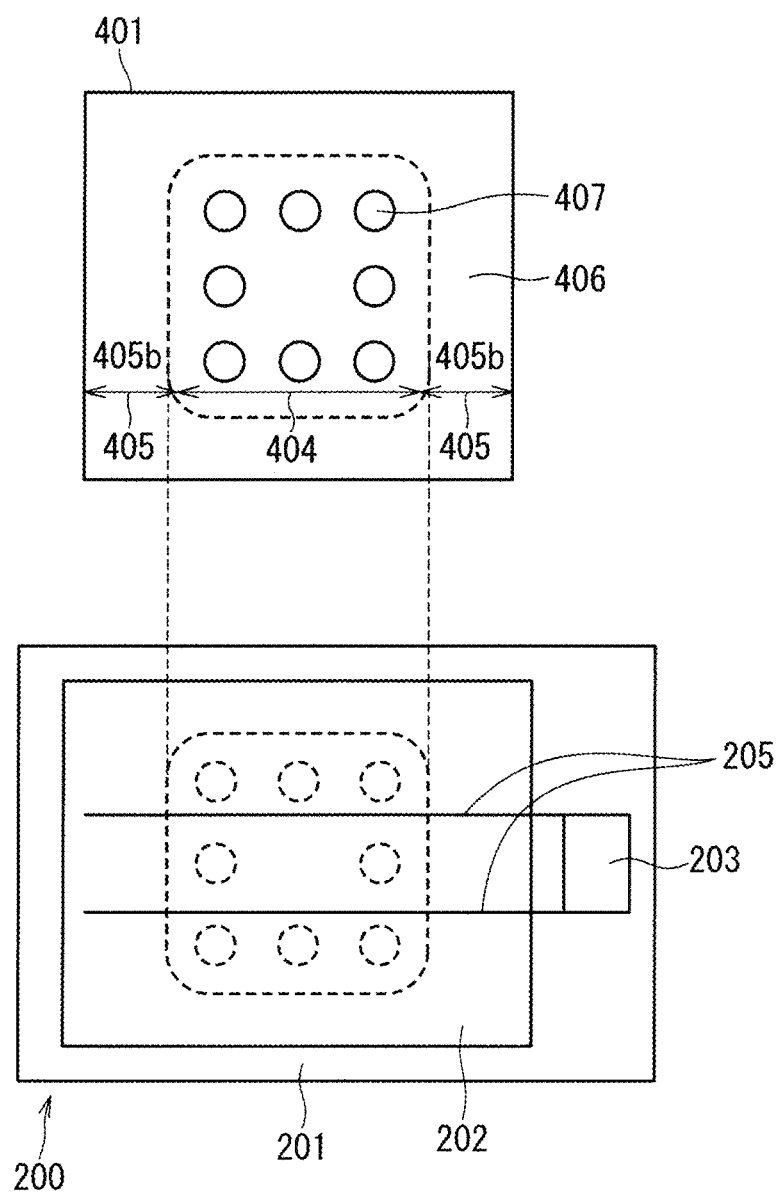
FIG. 9 A diagram illustrating a structure of a contact portion between an emitter intermediate electrode and an IGBT chip in Embodiment 2.

In FIG. 9, the contact surface of the emitter intermediate electrode 401 with the IGBT chip 200 is illustrated in the upper part, and the top view of the IGBT chip 200 is illustrated in the lower part. The IGBT chip 200 is provided with gate wiring 205 which is control wiring electrically separated from the emitter electrode 202 for supplying a gate current from the gate pad 203 to each cell. The gate wiring 205 is a low-resistance wiring layer formed on the front surface of the chip via $SiO_2$ or the like on the semiconductor substrate. The gate wiring 205 may be, for example, a metal film such as aluminum, a polysilicon film in which impurities are highly concentrated, or a laminated film thereof. Although two portions of gate wiring 205 are illustrated in the lower part of FIG. 9, the number of portions of gate wiring 205 can be arbitrarily changed in accordance with the size of the chip. Also, the gate pad 203 is arranged at an arbitrary position in the IGBT chip 200.

The dashed-line circles illustrated in the emitter electrode 202 in the lower part of FIG. 9 indicate positions where the conductor films 407 illustrated in the upper part of FIG. 9 come into contact. The pressure-contact semiconductor device of Embodiment 2 is different from the pressure-contact semiconductor device of Embodiment 1 in that the conductor films 407 are formed so as not to come into contact with the gate wiring 205 of the IGBT chip 200. In order to realize this structure, the alignment accuracy of the emitter intermediate electrode 401 and the IGBT chip 200 must be sufficiently high.

Figure 10:
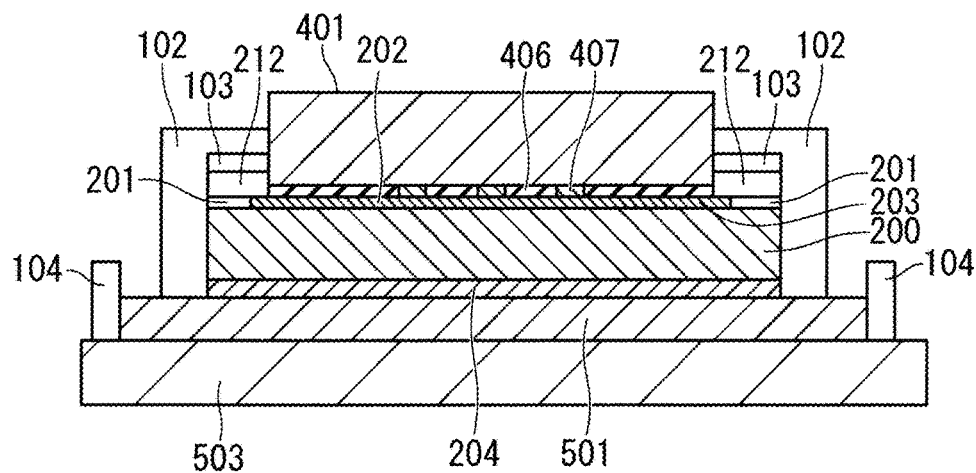
FIG. 10 A diagram illustrating a mounting example of the pressure-contact semiconductor device of Embodiment 2.

FIG. 10 illustrates an example of mounting a pressure-contact semiconductor device that achieves high alignment accuracy. In FIG. 10, the IGBT chip 200 is fixed to the collector intermediate electrode 501 with solder. A collector intermediate electrode guide 104 is provided on the collector common electrode plate 503, and the collector intermediate electrode 501 is arranged on the collector common electrode plate 503 along the collector intermediate electrode guide 104. That is, the position of the collector intermediate electrode 501 in the module is defined by the collector intermediate electrode guide 104.

A protective film 212 of the terminal region 201 is formed on the outer periphery of the IGBT chip 200 with polyimide or the like. A chip guide 102 is placed on the protective film 212 and fixed with an adhesive 103. The chip guide 102 is formed of, for example, a silicone resin. Next, by mounting the emitter intermediate electrode 401 on the IGBT chip 200 using the chip guide 102, the positional displacement between the emitter intermediate electrode 401 and the IGBT chip 200 is prevented.

Figure 11:
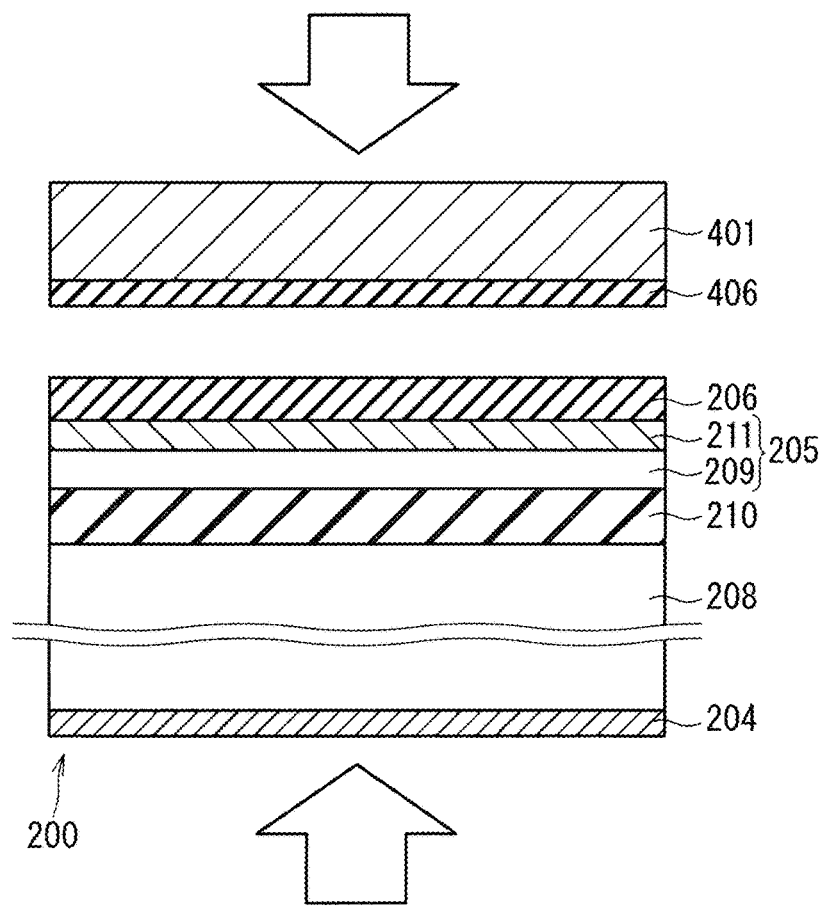
FIG. 11 A schematic cross-sectional view of an IGBT chip of Embodiment 2 passing through the gate wiring.

FIG. 11 is a schematic cross-sectional view of the IGBT chip 200 passing through the gate wiring 205. The IGBT chip 200 has a configuration in which a semiconductor layer 208, an insulating film 210, a polysilicon layer 209, a gate metal layer 211, and an insulating film 206 are laminated in this order. Of these, the polysilicon layer 209 and the gate metal layer 211 correspond to the gate wiring 205. The insulating films 206 and 210 are a second insulating film that covers the gate wiring 205. The insulating film 210 is made of $SiO_2$ or the like, and the insulating film 206 is made of SiN or the like. The gate wiring 205 is a low-resistance wiring layer above a trench in a trench gate type MOSFET or IGBT, and in a planar type MOSFET or IGBT, the gate wiring 205 is a low-resistance wiring layer electrically connected to the gate electrode of each transistor.

In the conventional pressure-contact semiconductor device, when the gate wiring 205 is pressurized by the emitter intermediate electrode 401, cracks may develop in the insulating film 206 in the vertical direction, and the gate metal layer 211 below thereof may be exposed on the front surface. When the emitter intermediate electrode 401 comes into contact with the gate metal layer 211, the gate electrode-emitter electrode of the IGBT is short-circuited, disabling the switching operation. Meanwhile, in the pressure-contact semiconductor device of Embodiment 2, as illustrated in FIG. 11, an insulating film 406 is formed in the region of the emitter intermediate electrode 401 located directly above the gate wiring 205. In other words, the conductor film 407 is formed at a position that does not overlap with the gate wiring 205 in plan view. Therefore, even if cracks are developed into the insulating film 206, the gate metal layer 211 is electrically separated from the emitter intermediate electrode 401 by the insulating film 406. Therefore, high pressure can be applied to the pressure-contact semiconductor device, the contact resistance between the semiconductor chip and the intermediate electrode is reduced, realizing a low-loss pressure-contact semiconductor device. Further, high pressure can be applied between the common electrode plates, voids between the IGBT chip 200 and the intermediate electrode are reduced. Therefore, such an incidence is suppressed from happening in which an arc discharge occurs in the void between the IGBT chip 200 and the intermediate electrode, leading to breakage thereof when the IGBT chip 200 is at the time of short-circuit fracture; therefore, the reliability of the module is improved.

D. Embodiment 3

A pressure-contact semiconductor device of Embodiment 3 is the pressure-contact semiconductor device in which the configuration of the contact portion between the front surface intermediate electrode 400 and the semiconductor chip is changed in the pressure-contact semiconductor device of Embodiment 1. Hereinafter, the configuration of the contact portion between the front surface intermediate electrode 400 and the semiconductor chip in the pressure-contact semiconductor device of Embodiment 3 will be described with reference to FIGS. 12 and 15.

Figure 12:
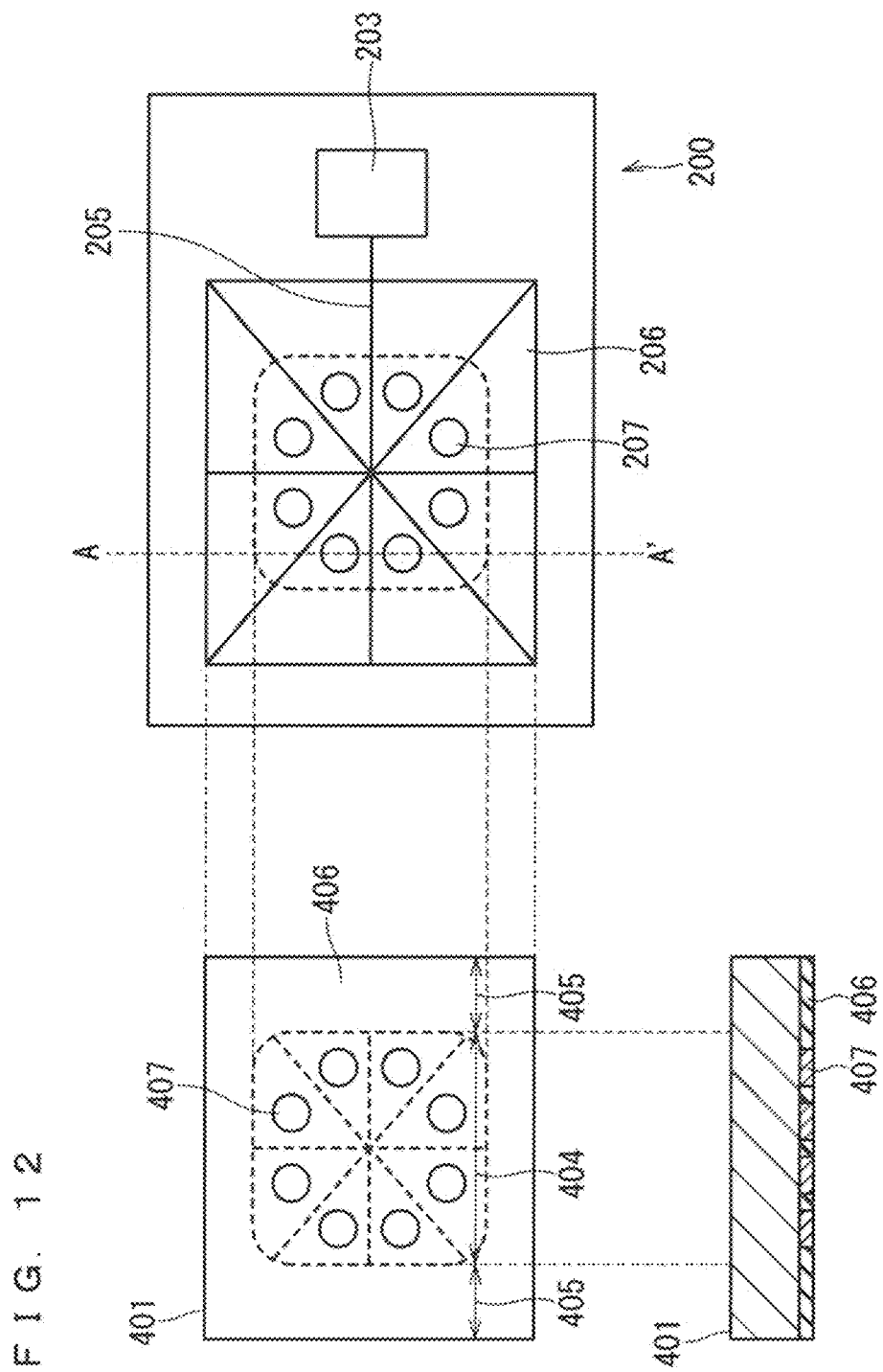
FIG. 12 A diagram illustrating a structure of a contact portion between an emitter intermediate electrode and an IGBT chip in Embodiment 3.

FIGS. 12 and 13 illustrate the configuration of the pressure-contact semiconductor device of Embodiment 3 on the IGBT side. FIG. 12 illustrates a top view of the contact surface of the emitter intermediate electrode 401 with respect to the IGBT chip 200, a cross-sectional view of the emitter intermediate electrode 401, and a top view of the IGBT chip 200. FIG. 13 is a cross-sectional view of the IGBT chip 200 along the line A-A' of FIG. 12.

As illustrated in FIG. 12, the gate wiring 205 is provided radially from the center of the cell region of the IGBT chip 200. The emitter electrode 202 is radially divided by the gate wiring 205, specifically by the insulating films 206 and 210 covering the gate wiring 205, and is a plurality of island-shaped electrodes as illustrated in FIG. 13. That is, the insulating films 206 and 210 are a third insulating film that divides the emitter electrode 202 into a plurality of islands. A large portion of the upper surface of each of the divided emitter electrodes 202 is covered with the insulating film 206 made of silicon dioxide or silicon nitride, and a conductor film 207 being a second conductor film, is formed on the remaining portion. The conductor film 207 is connected to the emitter electrode 202 below. The conductor film 207 is preferably arranged point-symmetrically with respect to the center of gravity of the contact surface on the contact surface of the IGBT chip 200 with respect to the emitter intermediate electrode 401. Also, as illustrated in FIG. 12, the conductor film 207 is preferably evenly arranged on each emitter electrode 202 divided by the gate wiring 205. Even arrangement means that the surface area of each divided conductor film 207 formed on each emitter electrode 202 are equal.

The conductor film 407 is formed at a position corresponding to the conductor film 207 in the connection region 404 on the contact surface of the emitter intermediate electrode 401 with respect to the IGBT chip 200, and comes into contact with the conductor film 207. The insulating film 406 is formed at the other position on the contact surface.

Figure 15:
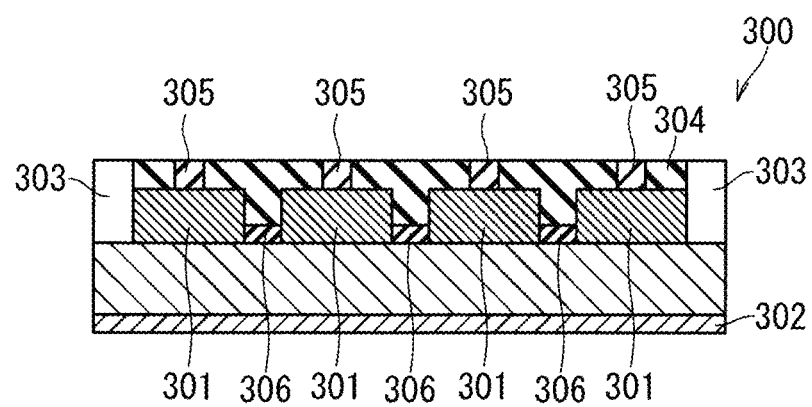
FIG. 15 A cross-sectional view of the diode chip along the line B-B' of FIG. 14.

FIGS. 14 and 15 illustrate the configuration of the pressure-contact semiconductor device of Embodiment 3 on the diode side. FIG. 14 illustrates a top view of the contact surface of an anode intermediate electrode 402 with respect to the diode chip 300, a cross-sectional view of the anode intermediate electrode 402, and a top view of the diode chip 300. FIG. 15 is a cross-sectional view of the diode chip 300 along the line B-B' of FIG. 14.

As illustrated in FIGS. 14 and 15, the anode electrode 301 is radially divided from the center by an insulating film 306 made of silicon dioxide or the like to form a plurality of island-shaped electrodes. A large portion of the upper surface of the anode electrode 301 is covered with the insulating film 304 made of silicon dioxide or silicon nitride, and a conductor film 305 is formed on the remaining portion. That is, the insulating films 304 and 306 function as a third insulating film that divides the anode electrode 301 into a plurality of islands. The conductor film 305 is connected to the anode electrode 301 below. The conductor films 305 are preferably arranged point-symmetrically with respect to the center of gravity of the contact surface of the diode chip 300 with respect to the anode intermediate electrode 402. Also, as illustrated in FIG. 14, the conductor film 305 is preferably evenly arranged on each anode electrode 301 divided by the insulating film 306. Even arrangement means that the surface area of each divided conductor film 305 formed on each anode electrode 301 are equal.

The conductor films 407 are formed at positions in contact with the conductor films 207 in the connection region 404 on the contact surface of the anode intermediate electrode 402 with respect to the diode chip 300, and the insulating film 406 is formed at the other position.

In the pressure-contact semiconductor device of Embodiment 3, the front surface electrode of the semiconductor chip is divided into a plurality of island-shaped electrodes, and a conductor film is evenly formed on each of the divided front surface electrodes. Accordingly, the contact resistance between each of the divided front surface electrodes and the front surface intermediate electrode 400 becomes uniform. Further, when a large current is applied and the amount of current applied to each front surface electrode becomes non-uniform for some reason, the current is applied to the front surface electrode having a small resistance and the temperature rises as compared with the other front surface electrodes. As the temperature rises, the resistance of the front surface electrode increases, so that the current non-uniformity in the semiconductor chip is spontaneously reduced. Accordingly, a local temperature rise in the semiconductor chip is suppressed and the reliability of the pressure-contact semiconductor device is improved.

E. Embodiment 4

A pressure-contact semiconductor device of Embodiment 4 is the pressure-contact semiconductor device in which the configuration of the contact portion between the emitter intermediate electrode 401 and the IGBT chip 200 is changed in the pressure-contact semiconductor device of Embodiment 2. Hereinafter, the configuration of the contact portion between the emitter intermediate electrode 401 and the IGBT chip 200 in the pressure-contact semiconductor device of Embodiment 4 will be described with reference to FIGS. 16 to 20. It should be noted that Embodiment 4 can also be combined with Embodiment 3.

Figure 16:
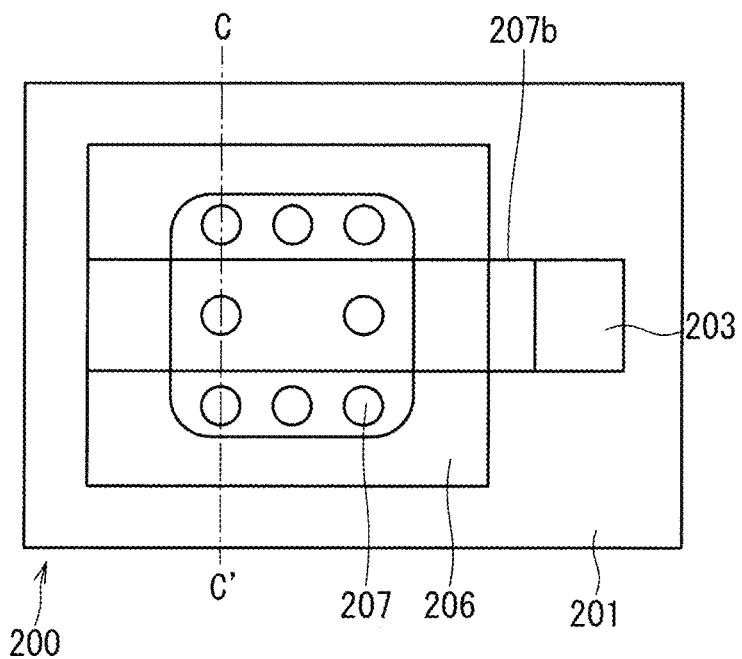
FIG. 16 A top view of the IGBT chip of Embodiment 4.
Figure 17:
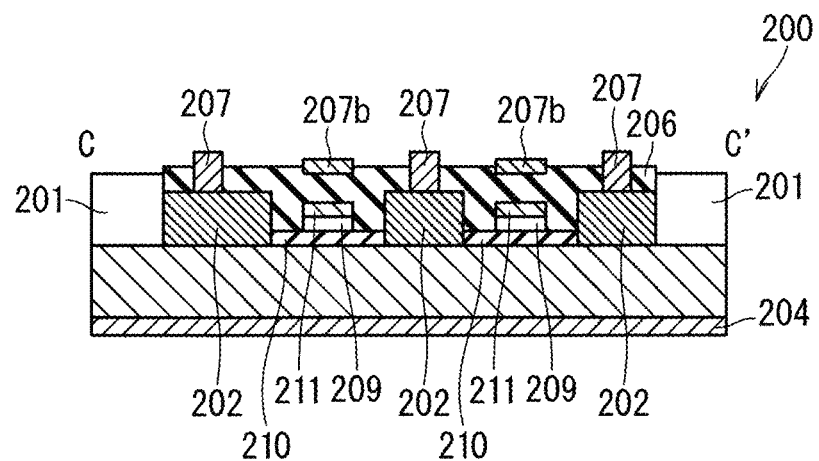
FIG. 17 A cross-sectional view of the IGBT chip along the line C-C' of FIG. 16.
Figure 18:
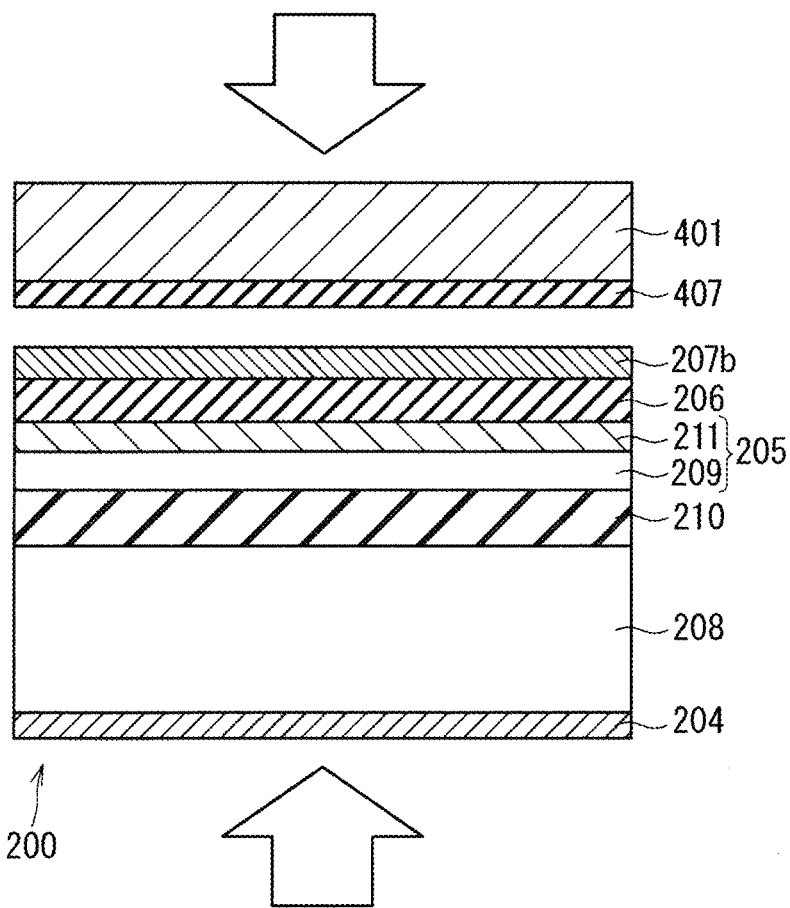
FIG. 18 A cross-sectional view of the IGBT chip of Embodiment 4 passing through the gate wiring.
Figure 19:
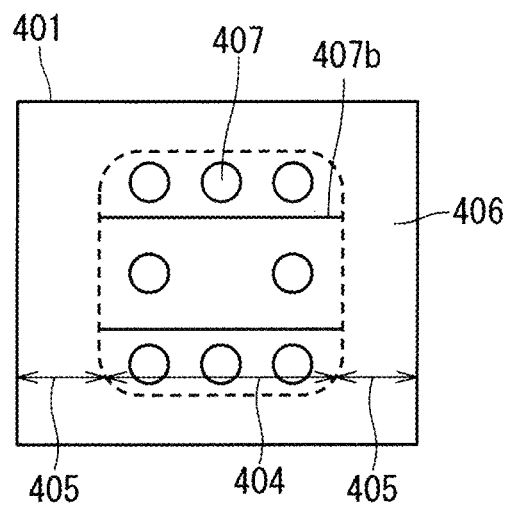
FIG. 19 A top view of a contact surface of an emitter intermediate electrode with respect to the IGBT chip of Embodiment 4.

FIG. 16 is a top view of the IGBT chip 200. FIG. 17 is a cross-sectional view of the IGBT chip 200 along the line C-C' of FIG. 16. FIG. 18 is a schematic cross-sectional view of the IGBT chip 200 passing through the gate wiring 205. FIG. 19 illustrates a top view of the contact surface of the emitter intermediate electrode 401 with respect to the IGBT chip 200.

The pressure-contact semiconductor device of Embodiment 4 is the pressure-contact semiconductor device in which, the IGBT chip 200 is provided with a conductor film 207b being the third conductor film, and the emitter intermediate electrode 401 is provided with a conductor film 407b, in the pressure-contact semiconductor device of Embodiment 2. Other than these, the configuration of the pressure-contact semiconductor device of Embodiment 4 is the same as that of the pressure-contact semiconductor device of Embodiment 2. The conductor film 207b is provided on the outermost surface of the region where the gate wiring 205 of the IGBT chip 200 is formed. The conductor film 407b is provided in a region of the connection region 404 of the emitter intermediate electrode 401 that comes into contact with the conductor film 207b. That is, the conductor film 207b and the conductor film 407b come into contact with each other.

As illustrated in FIG. 18, the IGBT chip 200 has a configuration in which a semiconductor layer 208, an insulating film 210, a polysilicon layer 209, a gate metal layer 211, an insulating film 206, and the conductor film 207b are laminated in this order. The insulating film 206 is made of silicon dioxide or silicon nitride. The conductor film 207b is formed of, for example, a single film or a laminated film formed of such as nickel, gold, or the like.

High positional accuracy is required for the emitter intermediate electrode 401 and the IGBT chip 200, since the conductor film 207b and the conductor film 407b are brought into contact with each other and the conductor film 207 and the conductor film 407 are brought into contact with each other. Therefore, positioning of the emitter intermediate electrode 401 is preferably implemented by the same method as in FIG. 10.

In the above, the pressure-contact semiconductor device of Embodiment 4 has been described as Modification to the pressure-contact semiconductor device of Embodiment 2. However, Embodiment 4 is also applicable to Embodiment 3.

As illustrated in FIG. 18, by forming the conductor film 207b, which is a relatively soft metal film, on the gate wiring 205, the unevenness existing in the emitter intermediate electrode 401 is absorbed by the conductor film 207b and the application of local high pressure on the gate wiring 205 is prevented. This prevents the insulating film 206 on the gate wiring 205 from being damaged by the pressure and the gate metal layer 211 from coming into contact with the emitter intermediate electrode 401. As a result, the reliability of the pressure-contact semiconductor device is improved, suppressing damage during manufacturing and improving productivity.

Figure 20:
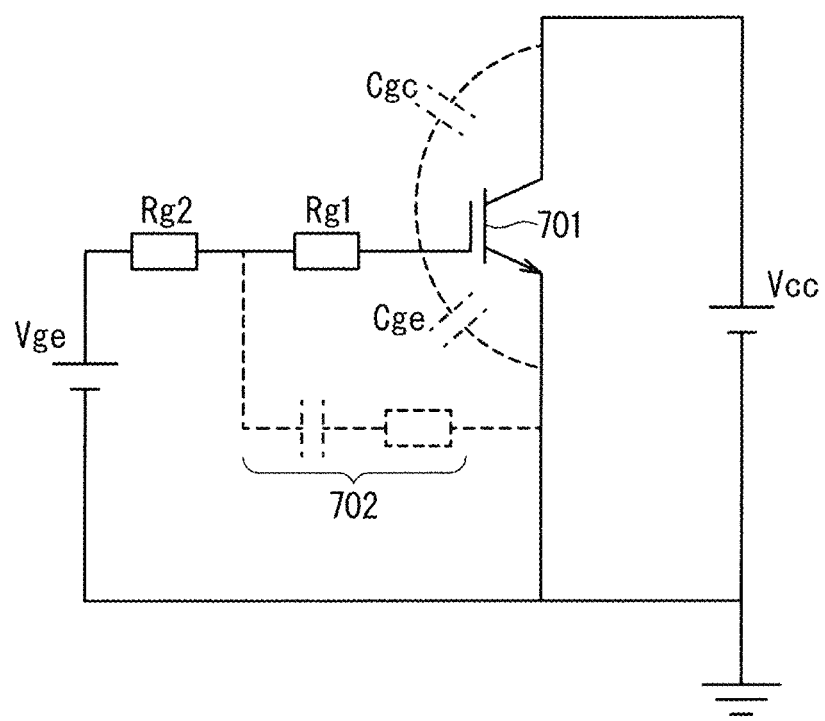
FIG. 20 A equivalent circuit diagram of the IGBT chip of Embodiment 4.

When the emitter intermediate electrode 401 and the IGBT chip 200 are pressed each other and the conductor film 407b and the conductor film 207b come into contact with each other, the conductor film 207b becomes an emitter potential. Meanwhile, the gate metal layer 211 becomes a gate potential due to the supply of the gate current from the gate pad 203. The equivalent circuit diagram of the IGBT chip 200 at this time is illustrated in FIG. 20. A power supply voltage Vcc and a gate-emitter voltage Vge are applied to an IGBT element 701. The internal gate resistor Rg1 and/or the external gate resistor Rg2 are connected to the gate electrode. Also, as illustrated by the broken line, the gate-collector capacitance Cgc as parasitic capacitances and the gate-emitter capacitance Cge are connected. Further, according to the structure of FIG. 18, the gate metal layer 211 and the conductor film 207b form a parallel plate capacitor via the insulating film 206. Further, the gate wiring 205 has a parasitic resistance; therefore, as illustrated by the broken line in FIG. 20, a parasitic snubber circuit 702 is formed between the gate and the emitter in parallel with the main gate wiring 205. Consequently, the oscillation of the gate voltage can be suppressed. The capacitance of the parasitic snubber circuit 702 can be controlled by the film thickness of the insulating film 206.

Let us consider a structure in which two IGBT elements are connected in series to form upper and lower arms. The lower arm IGBT is off and the upper arm IGBT turns on. At this point, a displacement current may flow in the feedback capacitance of the lower arm IGBT, causing the lower arm IGBT to erroneously ignite. This displacement current is proportional to the collector voltage change rate (dV/dt) of the upper arm IGBT and is one of the factors hindering the increase in the switching speed. Meanwhile, in the structure of Embodiment 4, the parasitic capacitance is charged with the displacement current between the gate and the emitter; therefore, the displacement current flowing between the gate and the emitter is suppressed, and the erroneous ignition is suppressed. Consequently, the upper arm IGBT and the lower arm IGBT are turned on at the same time to prevent the IGBT chip from being short-circuited and fractured, and the switching speed can be increased.

It should be noted that Embodiments of the present invention can be arbitrarily combined and can be appropriately modified or omitted without departing from the scope of the invention. While the invention has been described in detail, the forgoing description is in all aspects illustrative and not restrictive. It is understood that numerous other modifications can be devised without departing from the scope of the invention.

EXPLANATION OF REFERENCE SIGNS 102 chip guide, 103 adhesive, 104 collector intermediate electrode guide, 200 IGBT chip, 201, 303 terminal region, 202 emitter electrode, 203 gate pad, 204 collector electrode, 205 gate wiring, 206, 210, 304, 306 insulating film, 207, 207b, 305, 407, 407b conductor film, 208 semiconductor layer, 209 polysilicon layer, 211 gate metal layer, 212 protective film, 300 diode chip, 301 anode electrode, 302 cathode electrode, 400 front surface intermediate electrode, 401 emitter intermediate electrode, 402 anode intermediate electrode, 403 emitter common electrode plate, 404 connection region, 405 protective region, 500 rear surface intermediate electrode, 501 collector intermediate electrode, 502 cathode intermediate electrode, 503 collector common electrode plate, 601 control terminal, 701 IGBT terminal, 702 parasitic snubber circuit.

The invention claimed is:

1. A pressure-contact semiconductor device comprising:
a plurality of semiconductor chips each having a first main electrode and a second main electrode on a front surface and a rear surface thereof;
a first intermediate electrode facing the first main electrode of the semiconductor chip;
a first common electrode plate provided on a side opposite to a facing surface of the first intermediate electrode facing the first main electrode; and
a second common electrode plate provided facing the second main electrode, wherein
the facing surface of the first intermediate electrode facing the first main electrode is smaller than a facing surface of the first main electrode facing the first intermediate electrode, and has an outer peripheral protective region and a connection region surrounded by the protective region, the pressure-contact semiconductor device comprising
a plurality of first conductor films partially formed in the connection region, and
a first insulating film formed in regions in the connection region where no first conductor films are formed and in the protective region.

2. The pressure-contact semiconductor device according to claim 1, wherein
the plurality of first conductor films are formed point-symmetrically with respect to a center of gravity of the facing surface of the first intermediate electrode facing the first main electrode.

3. The pressure-contact semiconductor device according to claim 1, wherein
the semiconductor chip includes an IGBT chip and a diode chip connected in antiparallel to the IGBT chip.

4. The pressure-contact semiconductor device according to claim 1, wherein
the semiconductor chip includes the IGBT chip,
the IGBT chip includes
control wiring electrically separated from the first main electrode, and
a second insulating film covering the control wiring, and
the first conductor films are formed at places that do not overlap with the control wiring in plan view.

5. The pressure-contact semiconductor device according to claim 1, wherein
the first main electrode is divided into a plurality of islands by a third insulating film,
the semiconductor chip includes a second conductor film partially formed on each divided first main electrode,
surface areas of the second conductor film are equal among each of the divided first main electrodes, and
the first conductor films are formed at positions corresponding to the second conductor films in the connection region and come into contact with the second conductor films.

6. The pressure-contact semiconductor device according to claim 4, wherein
the IGBT chip is formed on the second insulating film and includes a third conductor film constituting a front surface of the IGBT chip.

\* \* \* \* \*